United States Patent
Chen et al.

(10) Patent No.: US 9,287,151 B2
(45) Date of Patent: Mar. 15, 2016

(54) SYSTEMS AND METHOD FOR TRANSFERRING A SEMICONDUCTOR SUBSTRATE

(71) Applicant: Taiwan Semiconductor Manufacturing Co., Ltd., Hsin-Chu (TW)

(72) Inventors: Ping-Yuan Chen, Hsinchu (TW); Chyi-Tsong Ni, Hsinchu (TW); Wen-Kung Cheng, Toufen Township, Miaoli County (TW); Huai-Te Huang, Hsinchu (TW)

(73) Assignee: TAIWAN SEMICONDUCTOR MANUFACTURING CO., LTD, Hsin-Chu (TW)

( * ) Notice: Subject to any disclaimer, the term of this patent is extended or adjusted under 35 U.S.C. 154(b) by 198 days.

(21) Appl. No.: 14/152,323

(22) Filed: Jan. 10, 2014

(65) Prior Publication Data

US 2015/0200120 A1    Jul. 16, 2015

(51) Int. Cl.
*H01L 21/31*      (2006.01)
*H01L 21/677*     (2006.01)
*H01L 21/67*      (2006.01)
*H01L 21/68*      (2006.01)

(52) U.S. Cl.
CPC .... *H01L 21/67742* (2013.01); *H01L 21/67109* (2013.01); *H01L 21/681* (2013.01)

(58) Field of Classification Search
CPC ............. H01L 21/67259; H01L 21/67742; H01L 21/68; H01L 21/67748; H01L 21/6715; H01L 21/677; H01L 21/67706; H01L 21/67265; H01L 2237/2817; H01L 2924/00; H01L 2924/00014; H01J 37/20; H01J 2237/082; H01J 37/244

USPC ............. 257/620, 668, E23.179, E21.122; 438/758

See application file for complete search history.

(56) References Cited

U.S. PATENT DOCUMENTS

| | | | | |
|---|---|---|---|---|
| 5,678,320 A * | 10/1997 | Thompson | ........ | H01L 21/67173 34/312 |
| 5,888,102 A * | 3/1999 | Strickland | ........ | H05K 3/301 361/809 |
| 6,374,143 B1* | 4/2002 | Berrang | ........ | A61N 1/0541 600/379 |
| 6,502,054 B1* | 12/2002 | Mooring | ........ | G05B 19/4083 702/149 |
| 6,510,365 B1* | 1/2003 | Nishinakayama | . | G05B 19/4015 318/568.13 |
| 6,612,801 B1* | 9/2003 | Koguchi | ........ | H01L 21/67028 414/404 |
| 7,758,338 B2* | 7/2010 | Hsiao | ........ | H01L 21/67017 432/198 |
| 2001/0003964 A1* | 6/2001 | Kitano | ........ | G03F 7/162 118/50 |
| 2004/0151574 A1* | 8/2004 | Lu | ........ | H01L 21/681 414/816 |
| 2006/0102285 A1* | 5/2006 | Bluck | ........ | H01L 21/67161 156/345.32 |
| 2006/0104795 A1* | 5/2006 | Mimken | ........ | H01L 21/67057 414/744.7 |
| 2006/0250594 A1* | 11/2006 | Iwashita | ........ | G03F 7/2022 355/53 |
| 2007/0194005 A1* | 8/2007 | Hirakawa | ........ | H01L 21/67748 219/403 |

(Continued)

*Primary Examiner* — Yosef Gebreyesus
(74) *Attorney, Agent, or Firm* — McClure, Qualey & Rodack, LLP (57) ABSTRACT

In accordance with some embodiments, systems and methods for processing a semiconductor substrate are provided. The method includes loading a semiconductor substrate from a chamber to a transfer module, detecting a center and a notch of the semiconductor substrate by the transfer module, and transferring the semiconductor substrate from the transfer module to a process chamber.

20 Claims, 10 Drawing Sheets

(56) References Cited

U.S. PATENT DOCUMENTS

| | | | | |
|---|---|---|---|---|
| 2007/0269293 | A1* | 11/2007 | Yu | H01L 21/67376 414/217 |
| 2007/0274711 | A1* | 11/2007 | Kaneyama | G02F 1/1303 396/611 |
| 2008/0236488 | A1* | 10/2008 | Takeshita | C23C 16/4401 118/719 |
| 2008/0280453 | A1* | 11/2008 | Koelmel | H01L 21/67115 438/758 |
| 2009/0081852 | A1* | 3/2009 | Tanaka | B24B 37/042 438/464 |
| 2009/0213347 | A1* | 8/2009 | Sugihara | G03F 7/70741 355/53 |
| 2010/0051597 | A1* | 3/2010 | Morita | H01L 21/67109 219/201 |
| 2010/0243437 | A1* | 9/2010 | Gessert | C23C 14/56 204/298.09 |
| 2011/0050882 | A1* | 3/2011 | Lee | G06K 9/3208 348/95 |
| 2011/0256663 | A1* | 10/2011 | Hollis | H01L 25/0652 438/107 |
| 2012/0247671 | A1* | 10/2012 | Sugawara | H01L 21/67346 156/345.31 |
| 2012/0289058 | A1* | 11/2012 | Hirano | H01L 21/67017 438/758 |

\* cited by examiner

SYSTEMS AND METHOD FOR TRANSFERRING A SEMICONDUCTOR SUBSTRATE

BACKGROUND

Semiconductor devices are used in a variety of electronic applications, such as personal computers, cell phones, digital cameras, and other electronic equipments. Semiconductor devices are fabricated by sequentially depositing insulating or dielectric layers, conductive layers, and semiconductive layers of different materials over a semiconductor substrate, and patterning the various layers using lithography to form circuit components and elements thereon. Many integrated circuits are manufactured on a single semiconductor wafer, and individual dies on the wafer are singulated by sawing between the integrated circuits along a scribe line. The individual dies are packaged separately, in multi-chip modules, or in other types of packaging, for example.

In the semiconductor processing field, various process chambers can be utilized in association with a wafer handling system or device to perform a variety of semiconductor processes. These processes may include annealing, cleaning, chemical vapor deposition, oxidation, and nitridation. The processes may be applied under vacuum, under gas pressure and with the application of heat.

However, the wafer usually has to be placed in a specific orientation before entering the process chambers, and has to have its temperature reduced after the processes. There are still many challenges related to reducing the entire processing time.

BRIEF DESCRIPTION OF THE DRAWINGS

For a more complete understanding of the illustrative embodiments and the advantages thereof, reference is now made to the following descriptions taken in conjunction with the accompanying drawings.

DETAILED DESCRIPTION OF THE ILLUSTRATIVE

Embodiments

The making and using of various embodiments of the disclosure are discussed in detail below. It should be appreciated, however, that the various embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description may include embodiments in which the first and second features are formed in direct or indirect contact.

Some variations of the embodiments are described. Throughout the various views and illustrative embodiments, like reference numbers are used to designate like elements. It is understood that additional operations can be provided before, during, and after the method, and some of the operations described can be replaced or eliminated for other embodiments of the method.

Figure 1A:
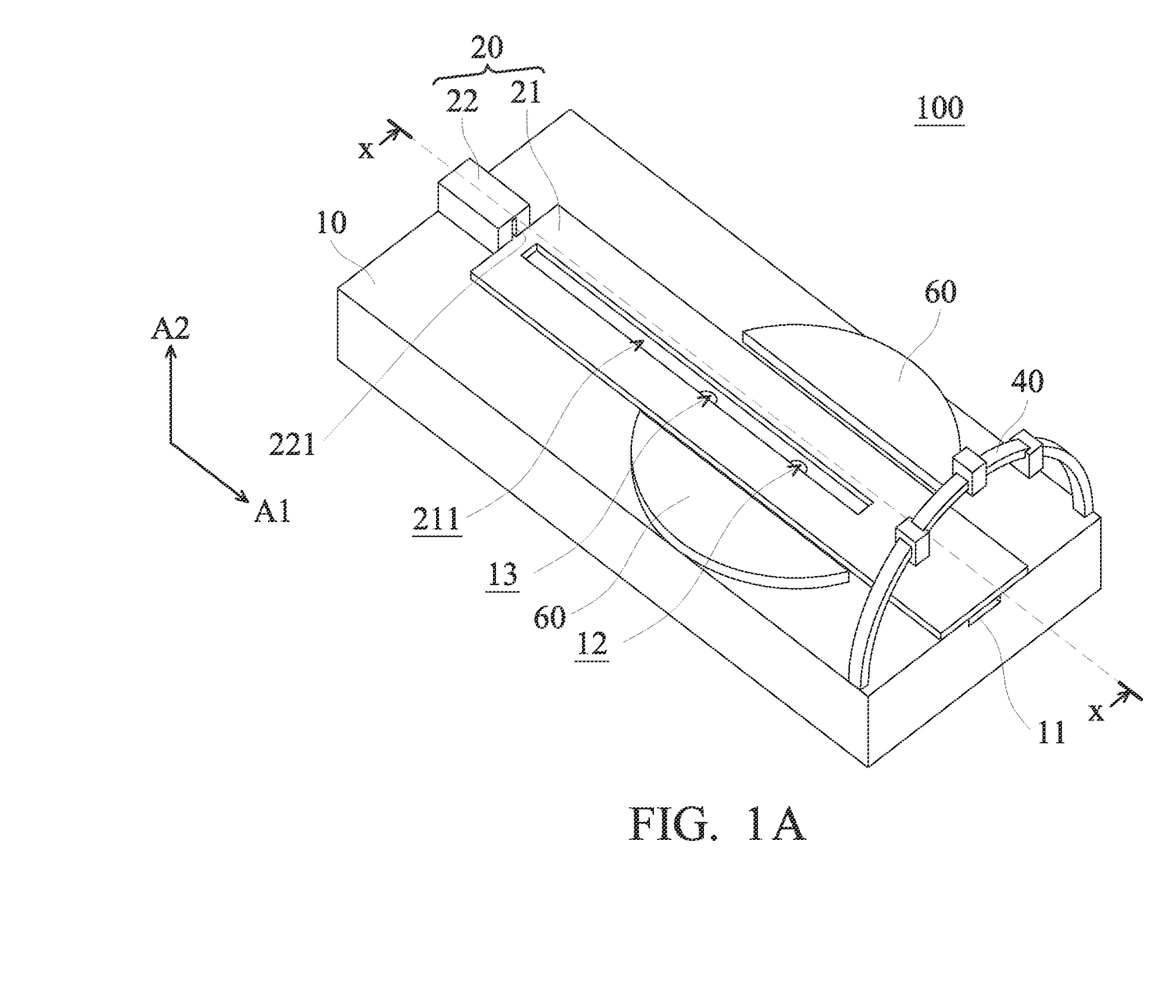
FIG. 1A shows a schematic diagram of a transfer module, in accordance with some embodiments of the disclosure.
Figure 1B:
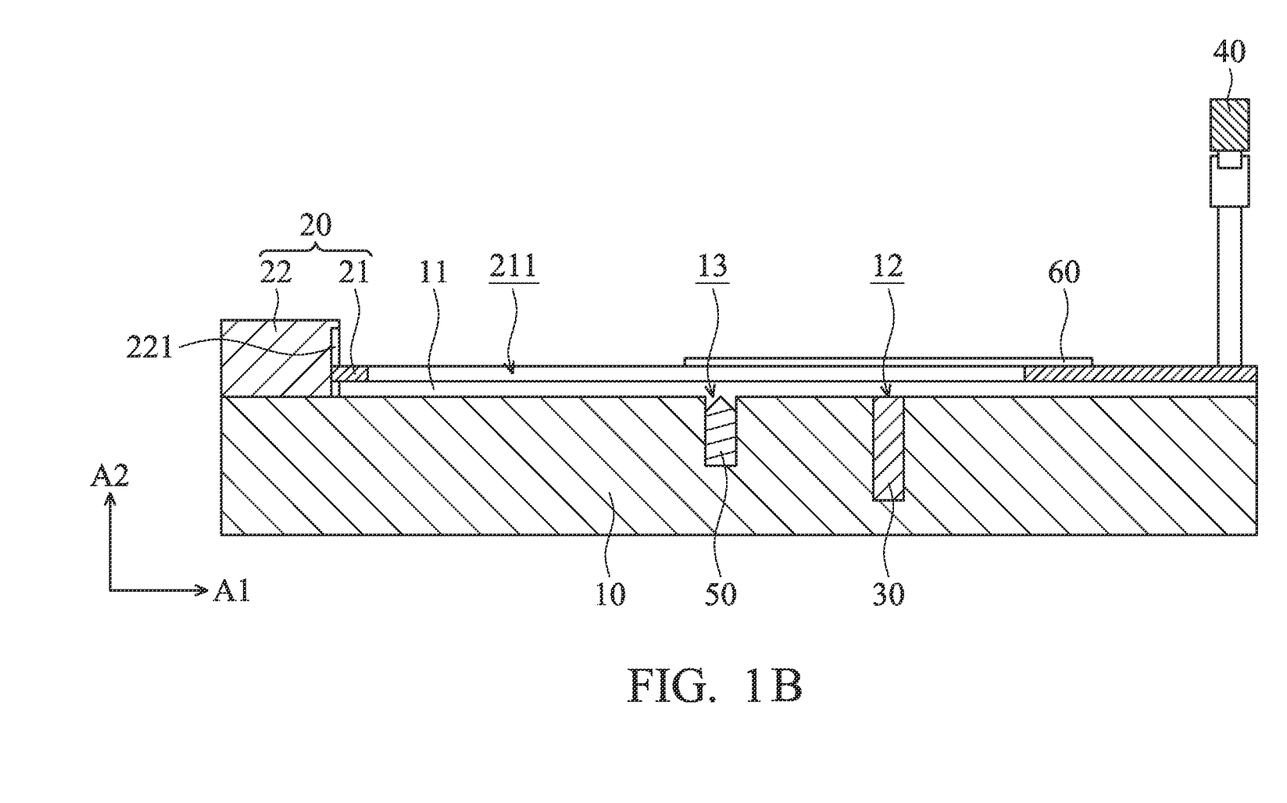
FIG. 1B shows a cross-sectional view taken along the line x-x of FIG. 1A, in accordance with some embodiments of the disclosure.

Embodiments of mechanisms for transferring a semiconductor substrate are provided. FIG. 1A shows a schematic diagram of a transfer module 100 according to some embodiments of the disclosure, and FIG. 1B shows a cross-sectional view taken along the line x-x in FIG. 1A. As shown in FIGS. 1A and 1B, the transfer module 100 includes a rotary stage 10, a carrier 20, a rotating member 30, a center detector 40, a notch detector 50, and two cooling members 60, in accordance with some embodiments. In some embodiments, the transfer module 100 has more than two cooling members 60. In some embodiments, the transfer module 100 has only one cooling member 60. In some embodiments, the carrier 20, the rotating member 30, the center detector 40, the notch detector 50, and the cooling members 60 form a transfer assembly incorporated with the stage 10.

A first rail 11 and two holes 12, 13 are formed on the stage 10, as shown in FIGS. 1A and 1B in accordance with some embodiments. The first rail 11 is extended along a first direction (indicated by the arrow A1 in FIGS. 1A and 1B). In some embodiments, the carrier 20 is movably connected to the first rail 11. Therefore, the carrier 20 can move along the first direction relative to the stage 10. The rotating member 30 and the notch detector 50 are respectively disposed in the holes 12, 13 in some embodiments. The center detector 40 is connected to the stage 10. As shown in FIGS. 1A and 1B, the cooling members 60 are disposed on the stage 10 and situated on opposite sides of the carrier 20, in accordance with some embodiments.

Referring to FIGS. 1A, 1B, the carrier 20 includes a first portion 21 and a second portion 22. In some embodiments, a second rail 221 is formed on the second portion 22 and extended along a second direction (indicated by the arrow A2 in FIGS. 1A, 1B). In some embodiments, the second direction is substantially perpendicular to the first direction. The first portion 21 is movably connected to the second rail 221, such that the first portion 21 can move along the second direction relative to the stage 10. As shown in FIG. 1A, a longitudinal groove 211 is formed on the first portion 21 and aligned with the holes 12, 13, in accordance with some embodiments.

Figure 2:
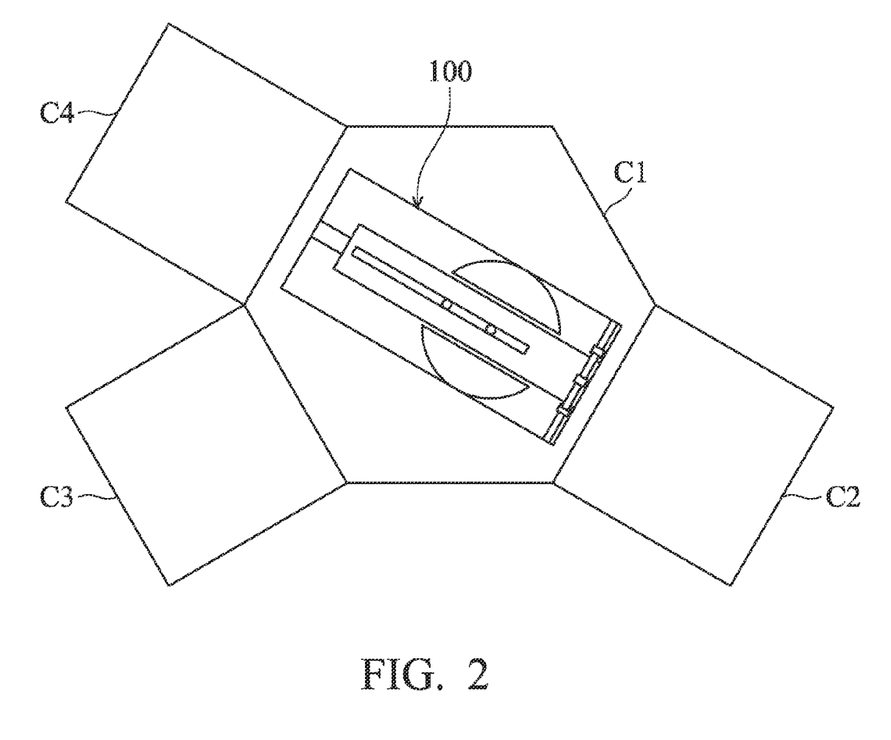
FIG. 2 shows a schematic diagram of a system for transferring a semiconductor substrate, in accordance with some embodiments of the disclosure.
Figure 3:
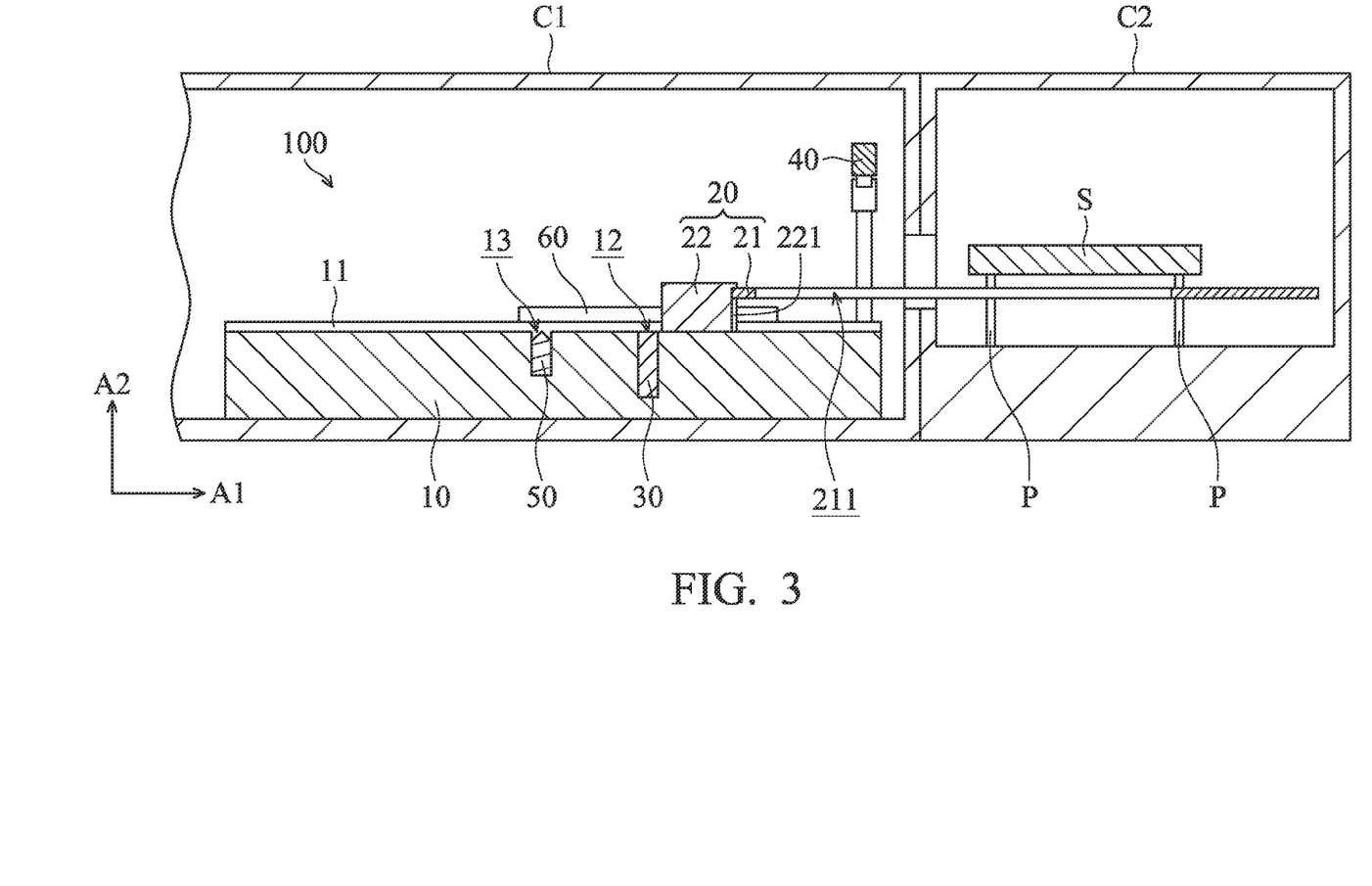
FIG. 3 shows a partial cross-sectional view of the system in FIG. 2, and a carrier of the transfer module that enters a storage chamber to load the semiconductor substrate, in accordance with some embodiments of the disclosure.

FIG. 2 shows a system for transferring a semiconductor substrate S (FIG. 3), in accordance with some embodiments. The semiconductor substrate S is, for example, semiconductor wafer. In some embodiments, the transfer module 100 is situated at the center of a station C1, which is connected to a storage chamber C2, a first process chamber C3, and a second process chamber C4. In some embodiments, the semiconductor substrate S is stored in the storage chamber C2, as shown in FIG. 3. The storage chamber C2 includes several movable pillars P. When the movable pillars P rise to sustain the semiconductor substrate S, the carrier 20 moves along the first rail 11 to the right, such that the first portion 21 enters the storage chamber C2 and reaches a position under the semiconductor substrate S, as shown in FIG. 3 in accordance with some embodiments.

After the movable pillars P move downward, the semiconductor substrate S can be disposed on the first portion 21, the carrier 20 moves back along the first rail 11. Therefore, the semiconductor substrate S can be transferred from the storage chamber C2 to the transfer module 100 in the station C1.

Figure 4:
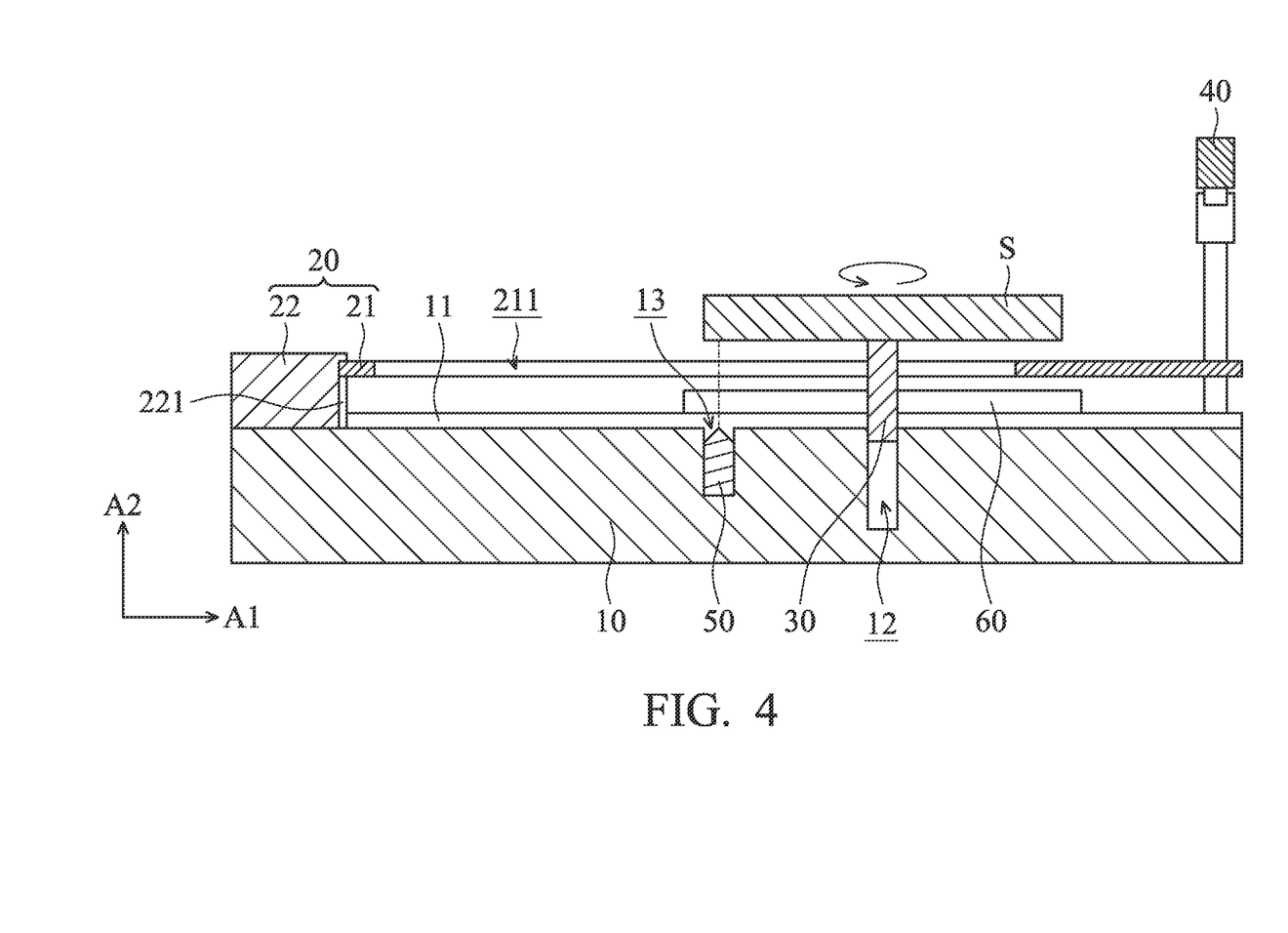
FIG. 4 shows a cross-sectional view of the transfer module, and a rotating element that rotates the semiconductor substrate, in accordance with some embodiments of the disclosure.

It should be noted that, when the semiconductor substrate S is transferred from the storage chamber C2 to the transfer module 100 in the station C1, the center detector 40 can emit light to detect the center of the semiconductor substrate S. Subsequently, as shown in FIG. 4, the rotating member 30 moves through the groove 211 to attach the center of the semiconductor substrate S, and rotates the semiconductor substrate S, in accordance with some embodiments. When the semiconductor substrate S is rotated, the notch detector 50 can emit light through the groove 211 to detect a notch of the semiconductor substrate S. Therefore, the semiconductor substrate S can be rotated to a specific angle (FIG. 4).

Figure 5:
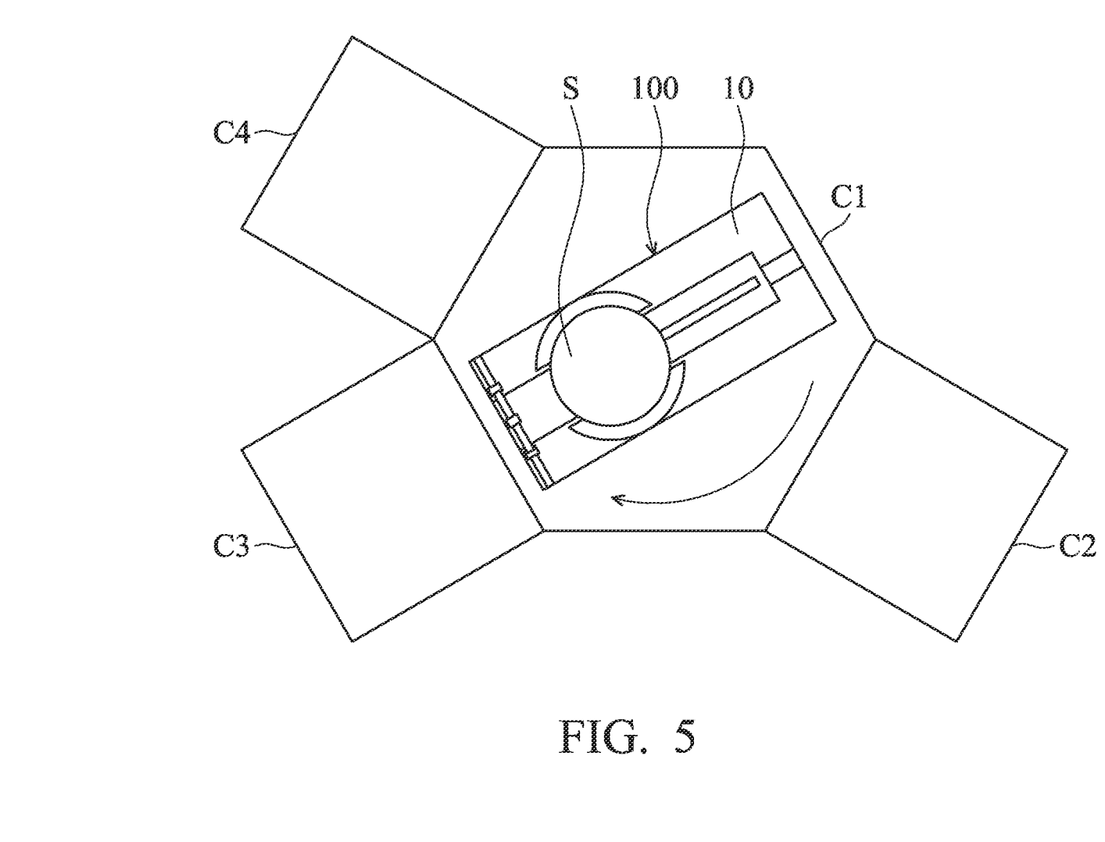
FIG. 5 shows a schematic diagram of the system in FIG. 2, and a stage of the rotating transfer module, in accordance with some embodiments of the disclosure.

Referring to FIG. 5, the stage 10 of the transfer module 100 rotates at the same time as the semiconductor substrate S is being rotated to the specific angle, in accordance with some embodiments. In some embodiments, the stage 10 of the transfer module 100 rotates after the semiconductor substrate S has been rotated to the specific angle. In some other embodiments, the stage 10 of the transfer module 100 rotates before the semiconductor substrate S is rotated to the specific angle.

As shown in FIG. 5, the semiconductor substrate S is transferred from the station C1 to the first process chamber C3 by the carrier 20 afterward, in some embodiments. The first process chamber C3 includes several movable pillars (not shown) similar to the movable pillars P in the storage chamber C2, in some embodiments. Therefore, the first portion 21 of the carrier 20 can safely place the semiconductor substrate S on the movable pillars. Afterwards, the movable pillars move downward to place the semiconductor substrate S on a platform in the first process chamber C3. After the first portion 21 leaves the first process chamber C3, the semiconductor substrate S can be processed in the first process chamber C3.

After the process is finished in the first process chamber C3, the semiconductor substrate S has a high temperature in some embodiments. For the purpose of reducing the temperature of the semiconductor substrate S, the transfer module 100 transfers the semiconductor substrate S from the first process chamber C3 to the transfer module 100 in the station C1 by using an operation similar to the operation of transferring it from the storage chamber C2 to the transfer module 100 in the station C1.

Figure 6:
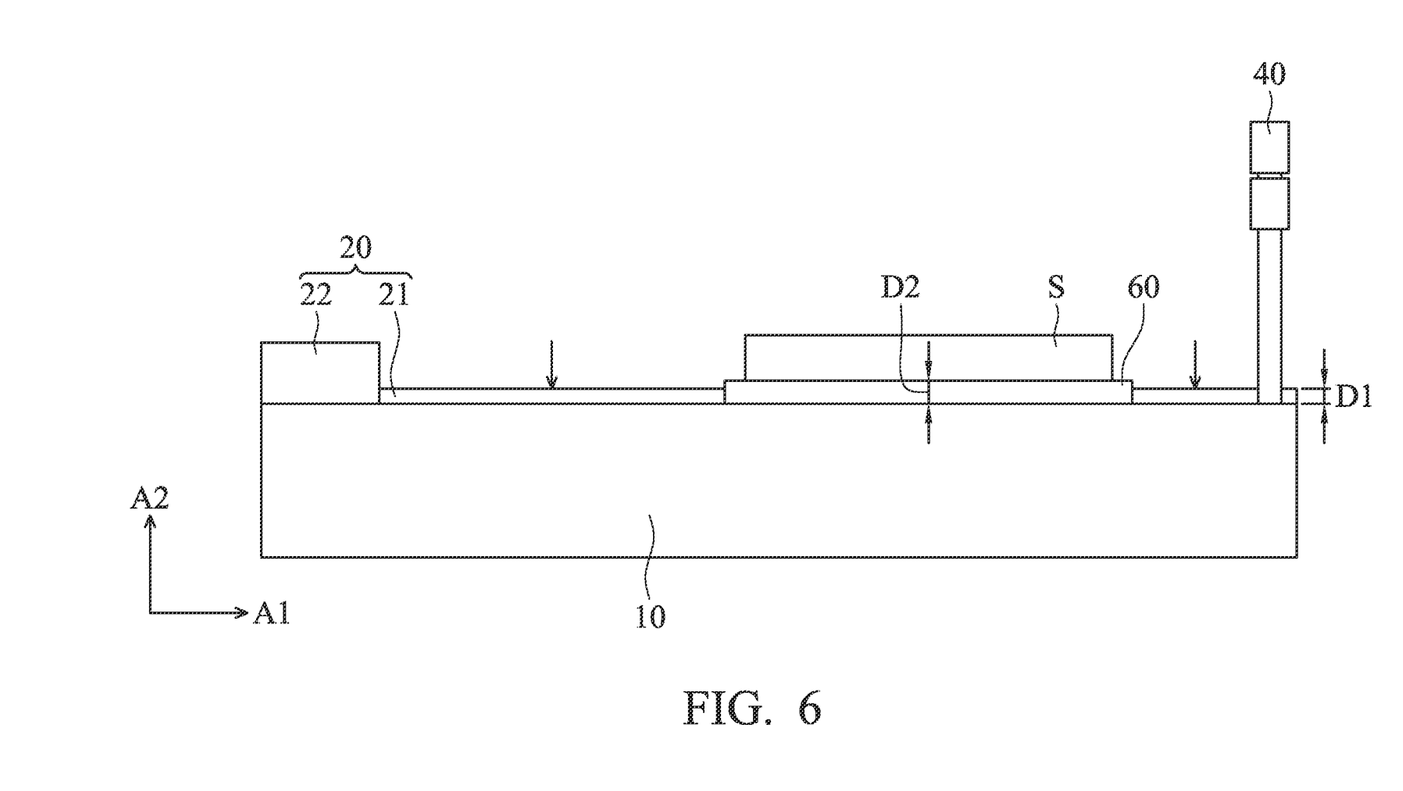
FIG. 6 shows a side view of the transfer module, and the semiconductor substrate is placed on a cooling member, in accordance with some embodiments of the disclosure.

As shown in FIG. 6, after the operation of transferring the semiconductor substrate S from the first process chamber C3 to the transfer module 100 in the station C1, the first portion 21 descends along the second direction and places the semiconductor substrate S on the cooling members 60, in accordance with some embodiments. As shown in FIG. 6, the thickness D2 of the cooling members 60 exceeds the thickness D1 of the first portion 21. In some embodiments, the cooling members 60 include passages (not shown) allowing a cooling liquid (water, for example) to pass therethrough. In some embodiments, the cooling liquid is injected and exported through pipes (not shown) in the stage 10. In some other embodiments, the cooling members 60 provide cooling gas for cooling the semiconductor substrate S. Therefore, the semiconductor substrate S is cooled by the cooling members 60.

When the operation of cooling the semiconductor substrate S is finished, the stage 10 rotates and the semiconductor substrate S is transferred from the transfer module 100 to the storage chamber C2 in some embodiments. In some other embodiments, when the operation of cooling the semiconductor substrate S is finished, the stage 10 rotates and the semiconductor substrate S is transferred from the transfer module 100 to the second process chamber C4.

In some embodiments, after the semiconductor substrate S is transferred from the first process chamber C3 to the transfer module 100 in the station C1, the stage 10 rotates and the semiconductor substrate S is transferred from the transfer module 100 to the second process chamber C4. The semiconductor substrate S can be processed in the second process chamber C4. The operation of cooling the semiconductor substrate S is executed after the process is finished in the second process chamber C4. In some embodiments, when the stage 10 rotates from the first process chamber C3 to the target chamber (such as the storage chamber C2 or the second process chamber C4), the cooling members 60 cool the semiconductor substrate S during the transportation.

In some embodiments, the first process chamber C3 or the second process chamber C4 is a CVD (chemical vapor deposition) chamber, PVD (physical vapor deposition) chamber, CMP (chemical mechanical polishing) chamber, photolithography chamber, etching chamber, or other pre-process chamber or post-process chamber.

Figure 7:
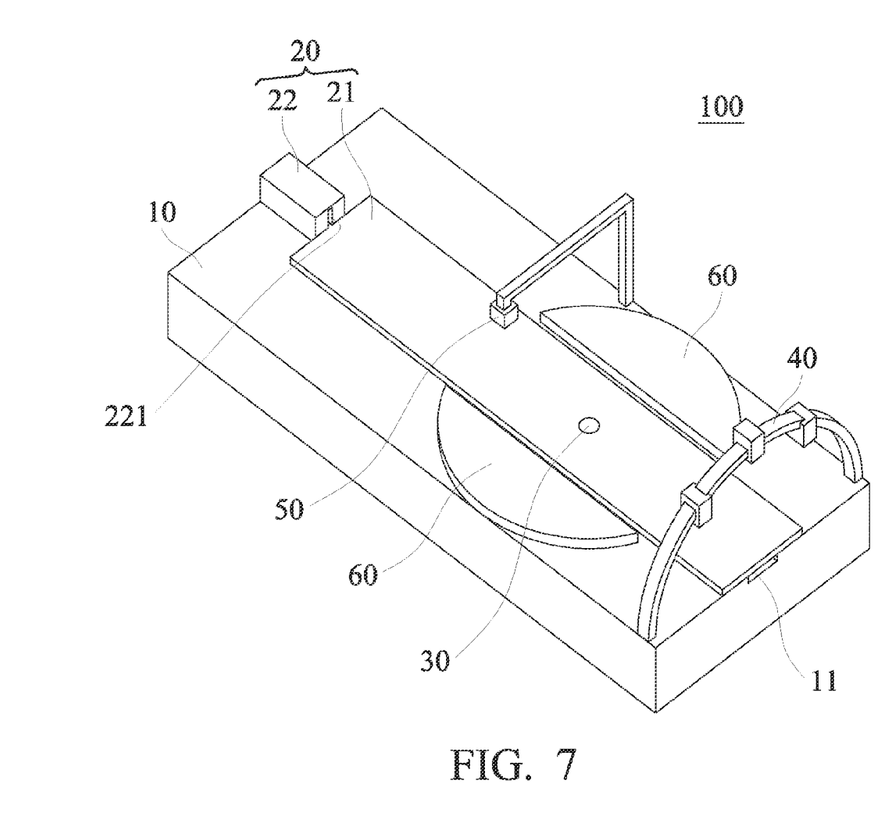
FIG. 7 shows a schematic diagram of a transfer module, in accordance with some embodiments of the disclosure.

In some embodiments, as shown in FIG. 7, the carrier 20 is disposed between the center detector 40 and the stage 10, and the rotating member 30 is disposed on the carrier 20.

Figure 8:
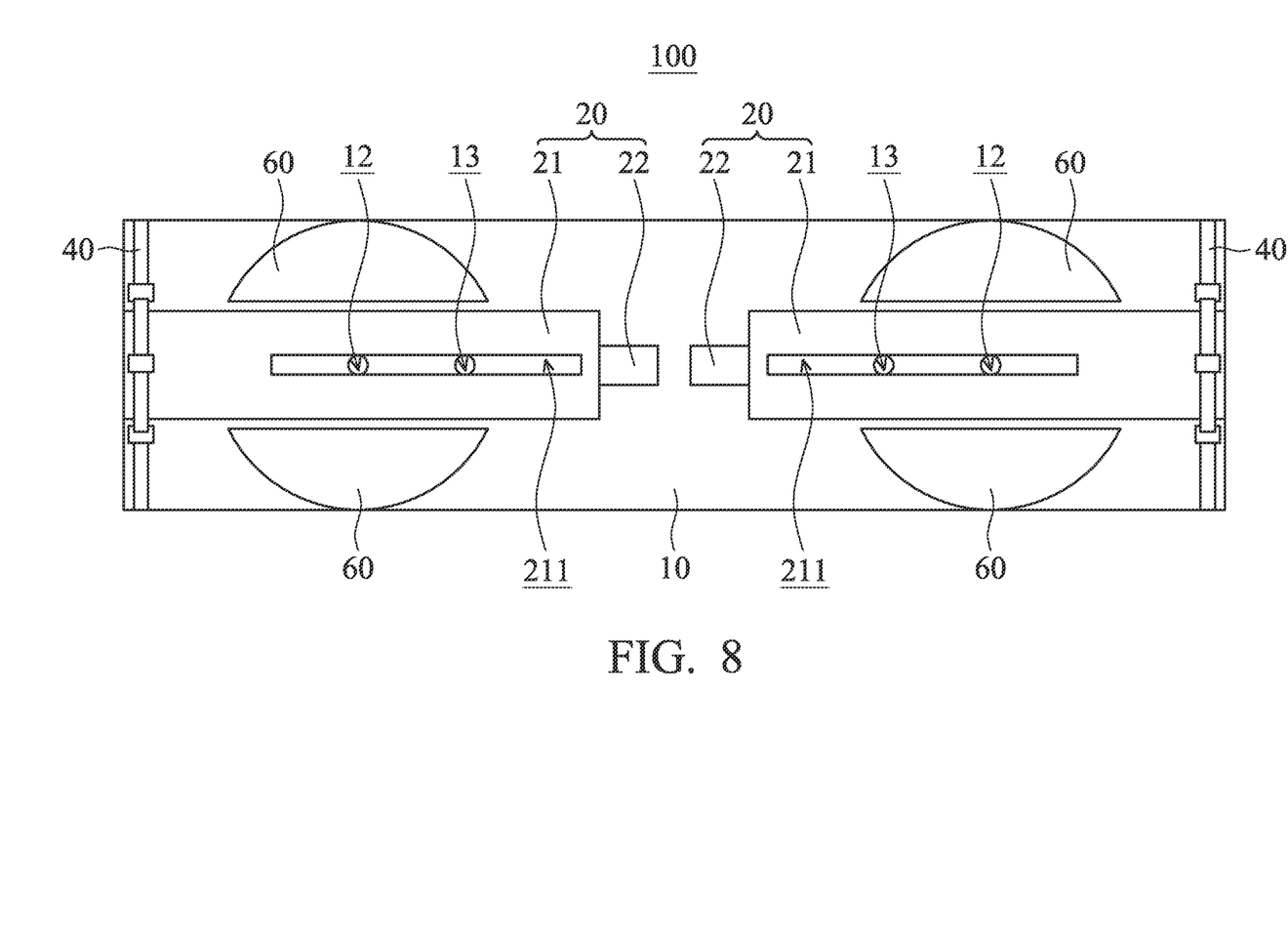
FIG. 8 shows a schematic diagram of a transfer module, in accordance with some embodiments of the disclosure.

Referring to FIG. 8, in some embodiments, a transfer module 100 includes two transfer assemblies. In some embodiments, the transfer assemblies are positioned on the opposite sites of the stage 10. Therefore, the transfer module 100 can transfer two semiconductor substrates S at the same time. In accordance with some embodiments, the transfer module 100 includes more than two transfer assemblies (for example, three to six transfer assemblies), and the efficiency of processing the semiconductor substrates S can be upgraded.

Figure 9:
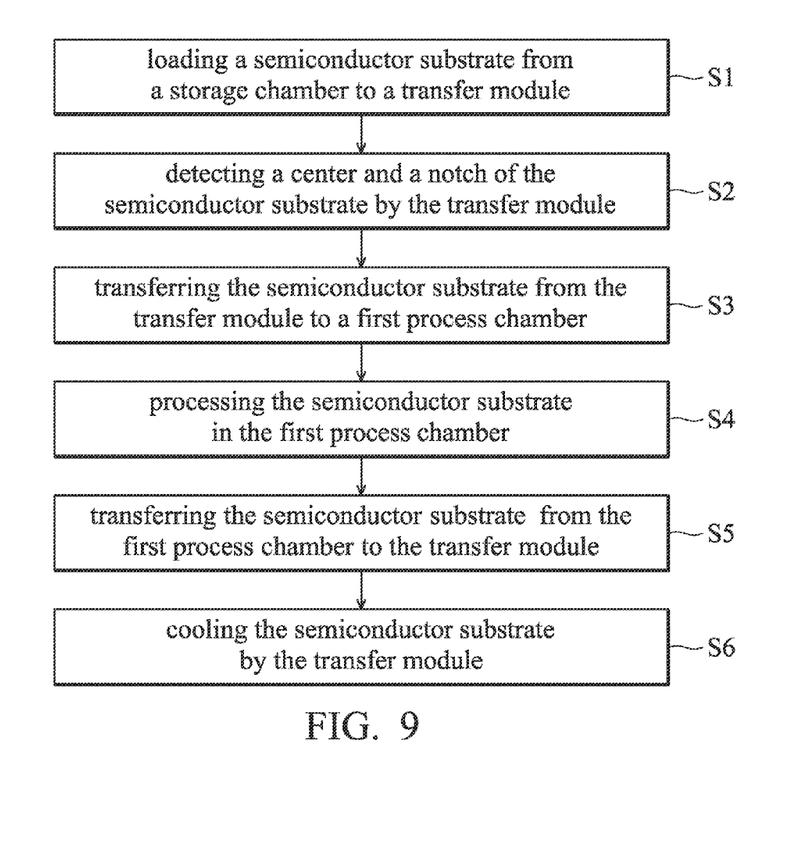
FIG. 9 shows a flow chart of a method for processing a semiconductor substrate, in accordance with some embodiments of the disclosure.

FIG. 9 illustrates a flow chart of a method for processing a semiconductor substrate S, in accordance with some embodiments. First, a semiconductor substrate S is loaded from a storage chamber to a transfer module 100 (operation S1). As shown in FIGS. 2 and 3, the operation S1 includes raising a movable pillar P along a second direction in the storage chamber C2 to hold the semiconductor substrate S in accordance with some embodiments. In some embodiments, the operation S1 also includes moving a carrier 20 of the transfer module 100 along a first direction into the storage chamber C2 and under the semiconductor substrate S. In some embodiments, the operation S1 further includes lowering the movable pillar P in the storage chamber C2, and moving the carrier 20 back along the first direction.

Afterwards, a center and a notch of the semiconductor substrate S can be detected by the transfer module 100 (operation S2). As shown in FIG. 4, the operation S2 includes detecting a center of the semiconductor substrate S by a center detector 40 of the transfer module 100 in accordance with some embodiments. In some embodiments, the operation S2 also includes rotating the semiconductor substrate S by a rotating member 30 of the transfer module 100. In some embodiments, the operation S2 further includes detecting a notch of the semiconductor substrate S by a notch detector 50 of the transfer module 100.

The following operation is to transfer the semiconductor substrate S from the transfer module 100 to a first process chamber C3 (operation S3). As shown in FIG. 5, the operation S3 includes rotating a stage 10 of the transfer module 100, and moving the carrier 20 of the transfer module 100 along a first direction into the first process chamber C3 in accordance with some embodiments. In some embodiments, the operation S3 also includes raising a movable pillar along a second direction in the first process chamber C3 to hold the semiconductor substrate S. In some embodiments, the operation S3 further includes moving the carrier 20 back along the first direction, and lowering the movable pillar with the semiconductor substrate S in the first process chamber C3. Subsequently, the semiconductor substrate S can be processed in the first process chamber C3 (operation S4).

After the operation S4, the semiconductor substrate S is transferred from the first process chamber C3 to the transfer module 100 (operation S5), and the temperature of the semiconductor substrate S is reduced by the transfer module 100 (operation S6). The operation S5 includes raising a movable pillar along a second direction in the first process to hold the semiconductor substrate S in accordance with some embodiments. In some embodiments, the operation S5 also includes moving a carrier 20 of the transfer module 100 along a first direction into the storage chamber C2 and under the semiconductor substrate S. In some embodiments, the operation S5 further includes lowering the movable pillar in the storage chamber C2, and moving back the carrier 20 along the first direction. As shown in FIG. 6, the operation S6 includes lowering a first portion 21 along the second direction to place the semiconductor substrate S on the cooling member 60 in accordance with some embodiments. In some embodiments, the operation S6 also includes cooling the semiconductor substrate S by cooling member 60.

In some embodiments, the method further includes rotating the stage 10 and transferring the semiconductor substrate S from the transfer module 100 to a second process chamber C4 after the operation S5 or S6. In some embodiments, the method further includes detecting the center and notch of the semiconductor substrate S after the operation S5. In some embodiments, the method further includes transferring the semiconductor substrate S from the transfer module 100 to the storage chamber C2 after the operation S5.

Embodiments of systems and methods for transferring a semiconductor substrate are provided. A center detector, a notch detector, and a cooling member are included in a transfer module. A center or notch of the semiconductor substrate can be detected, and the semiconductor substrate can be cooled by the cooling member when the semiconductor substrate is transferred from a chamber to another chamber. As a result, the time required for processing can be reduced.

According to some embodiments, a method for processing a semiconductor substrate is provided. The method includes loading a semiconductor substrate from a chamber to a transfer module. The method also includes detecting a center and a notch of the semiconductor substrate by the transfer module. The method further includes transferring the semiconductor substrate from the transfer module to a process chamber.

According to some embodiments, a transfer module is provided. The transfer module includes a stage and a carrier. The carrier is connected to the stage and movable with respect to the stage along a first direction. The transfer module also includes a rotating member, which is connected to the stage. The transfer module further includes a center detector and a notch detector. The center detector and the notch detector are connected to the stage and configured to detect a center and a notch of the semiconductor substrate.

According to some embodiments, a system for transferring a semiconductor substrate is provided. The system includes a storage chamber and a first process chamber. The system also includes a station, which is connected to the storage chamber and the first process chamber. The system further includes a transfer module positioned in the station, including a stage, a carrier, a rotating member, a center detector, and a notch detector. The carrier is connected to the stage and movable with respect to the stage along a first direction. The rotating member, the center detector, and the notch detector are connected to the stage, a center and a notch of the semiconductor substrate is detected by the center detector and the notch detector.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method for processing a semiconductor substrate, comprising:
    loading a semiconductor substrate from a chamber to a transfer module, the transfer module having a stage and a carrier, the carrier being connected to the stage and movable with respect to the stage along a first direction, the carrier having at least one groove formed therethrough;

detecting a center and a notch of the semiconductor substrate by the transfer module, wherein at least one of the center and the notch detecting is performed through the at least one groove in the carrier; and transferring the semiconductor substrate from the transfer module to a process chamber.

2. The method as claimed in claim 1, wherein the operation of loading the semiconductor substrate comprises:
raising a movable pillar in the chamber to hold the semiconductor substrate;
moving the carrier of the transfer module into the chamber and under the semiconductor substrate;
lowering the movable pillar in the chamber; and
moving back the carrier of the transfer module.

3. The method as claimed in claim 1, wherein the operation of detecting the center and the notch of the semiconductor substrate comprises:
detecting the center of the semiconductor substrate by a center detector of the transfer module;
rotating the semiconductor substrate by a rotating member of the transfer module after extending the rotating member through the at least one groove of the carrier; and
detecting the notch of the semiconductor substrate by a notch detector of the transfer module.

4. The method as claimed in claim 1, wherein the operation of transferring the semiconductor substrate comprises:
rotating a stage of the transfer module; and
moving a carrier of the transfer module into the process chamber;
raising a movable pillar in the process chamber to hold the semiconductor substrate;
moving back the carrier of the transfer module; and
lowering the movable pillar with the semiconductor substrate in the process chamber.

5. The method as claimed in claim 1, further comprising:
processing the semiconductor substrate in the process chamber.

6. The method as claimed in claim 1, further comprising:
transferring the semiconductor substrate from the process chamber to the transfer module; and
cooling the semiconductor substrate by the transfer module.

7. The method as claimed in claim 6, wherein the operation of cooling the semiconductor substrate comprises:
lowering the carrier of the transfer module to place the semiconductor substrate on a cooling member of the transfer module; and
cooling the semiconductor substrate by the transfer module.

8. The method as claimed in claim 1, further comprising:
transferring the semiconductor substrate from the process chamber to the transfer module; and
transferring the semiconductor substrate from the transfer module to a second process chamber.

9. A transfer module for transferring a semiconductor substrate, comprising:
a stage;
a carrier, connected to the stage and movable with respect to the stage along a first direction, the carrier having at least one groove formed therethrough;
a rotating member, connected to the stage and being aligned with the at least one groove of the carrier, the rotating member being movable between a retracted positon and an extended position such that, in the extended position, the rotating member extends through the at least one groove of the carrier with a distal end of the rotating member protruding beyond an upper surface of the carrier to contact a semiconductor substrate carried by the carrier for rotating the semiconductor substrate;
a center detector, connected to the stage and configured to detect a center of the semiconductor substrate; and
a notch detector, connected to the stage and configured to detect a notch of the semiconductor substrate.

10. The transfer module as claimed in claim 9, further comprising:
a cooling member, disposed on the stage and configured to cool the semiconductor substrate.

11. The transfer module as claimed in claim 10, wherein the carrier comprises a first portion and a second portion, and the first portion is connected to the second portion and movable with respect to the second portion along a second direction substantially perpendicular to the first direction.

12. The transfer module as claimed in claim 11, wherein the thickness of the cooling member exceeds that of the first portion.

13. The transfer module as claimed in claim 11, wherein the first portion is extended along the second direction.

14. The transfer module as claimed in claim 9, further comprising:
a plurality of cooling members, disposed on opposite sides of the carrier and configured to cool the semiconductor substrate.

15. The transfer module as claimed in claim 9, wherein the carrier is positioned between the center detector and the stage.

16. The transfer module as claimed in claim 9, wherein the notch detector is positioned in the stage and aligned with the at least one groove of the carrier.

17. The transfer module as claimed in claim 9, wherein the carrier is positioned between the notch detector and the stage.

18. A system for transferring a semiconductor substrate, comprising:
a storage chamber;
a first process chamber;
a station, connected to the storage chamber and the first process chamber; and
a transfer module, positioned in the station, comprising:
a stage;
a carrier, connected to the stage and movable with respect to the stage along a first direction, the carrier having at least one groove formed therethrough;
a rotating member, connected to the stage;
a center detector, connected to the stage for detecting a center of the semiconductor substrate; and
a notch detector, connected to the stage and aligned with the at least one groove of the carrier for detecting a notch of the semiconductor substrate through the at least one groove of the carrier.

19. The system as claimed in claim 18, wherein the first chamber comprises a movable pillar for sustaining the semiconductor substrate.

20. The system as claimed in claim 18, further comprising:
a second process chamber, connected to the station.

* * * * *